(12) United States Patent
Basler et al.

(10) Patent No.: US 11,276,754 B2
(45) Date of Patent: Mar. 15, 2022

(54) SEMICONDUCTOR DEVICE INCLUDING TRENCH STRUCTURE AND MANUFACTURING METHOD

(71) Applicant: Infineon Technologies AG, Neubiberg (DE)

(72) Inventors: Thomas Basler, Ottenhofen (DE); Caspar Leendertz, Munich (DE); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/811,293

(22) Filed: Mar. 6, 2020

(65) Prior Publication Data
US 2020/0286991 A1    Sep. 10, 2020

(30) Foreign Application Priority Data
Mar. 7, 2019 (DE) .......................... 102019105812.0

(51) Int. Cl.
*H01L 29/08* (2006.01)
*H01L 29/16* (2006.01)
(Continued)

(52) U.S. Cl.
CPC ........ *H01L 29/086* (2013.01); *H01L 21/0465* (2013.01); *H01L 29/063* (2013.01);
(Continued)

(58) Field of Classification Search
CPC . H01L 29/086; H01L 29/1608; H01L 29/063; H01L 29/66068; H01L 29/32;
(Continued)

(56) References Cited

U.S. PATENT DOCUMENTS 9,209,276 B2 * 12/2015 Nakamura ........ H01L 21/28008
2002/0160557 A1 10/2002 Peake et al.

OTHER PUBLICATIONS

Hatta, Hideyuki, et al., "Suppression of Short-Circuit Current with Embedded Source Resistance in SiC-MOSFET", Materials Science Forum, vol. 924, pp. 727-730.

* cited by examiner

*Primary Examiner* — Cuong B Nguyen
(74) *Attorney, Agent, or Firm* — Murphy, Bilak & Homiller, PLLC

(57) ABSTRACT

An embodiment of a semiconductor device includes a silicon carbide semiconductor body including source and body regions of opposite conductivity types. A trench structure extends from a first surface into the silicon carbide semiconductor body along a vertical direction, and includes a gate electrode and a gate dielectric. A contact is electrically connected to the source region at the first surface. The source region includes a first source sub-region directly adjoining the contact at a source contact area of the first surface, a second source sub-region, and a third source sub-region. The second sub-region is arranged between the first and third sub-regions along the vertical direction. A doping concentration profile along the vertical direction of the source region includes a doping concentration minimum in the second sub-region and a doping concentration maximum in the third sub-region. Each of the second and third sub-regions overlaps with the source contact area.

11 Claims, 4 Drawing Sheets

(51) Int. Cl.
*H01L 29/06* (2006.01)
*H01L 29/66* (2006.01)
*H01L 29/32* (2006.01)
*H01L 29/78* (2006.01)
*H01L 21/04* (2006.01)
*H01L 29/10* (2006.01)

(52) U.S. Cl.
CPC ...... *H01L 29/1095* (2013.01); *H01L 29/1608* (2013.01); *H01L 29/32* (2013.01); *H01L 29/66068* (2013.01); *H01L 29/7813* (2013.01)

(58) Field of Classification Search
CPC ............. H01L 29/7813; H01L 21/0465; H01L 29/1095; H01L 29/45; H01L 29/0619; H01L 29/0847; H01L 29/4232; H01L 29/78; H01L 29/41741; H01L 29/401; H01L 29/66734; H01L 29/0865; H01L 29/0869
See application file for complete search history.

SEMICONDUCTOR DEVICE INCLUDING TRENCH STRUCTURE AND MANUFACTURING METHOD

TECHNICAL FIELD

The present disclosure is related to semiconductor devices, in particular to silicon carbide (SiC) semiconductor devices and manufacturing methods therefor.

BACKGROUND

Technology development of SiC semiconductor devices including field effect transistor cells aims at reducing an area-specific on-state resistance $R_{DS(on)}$ without adversely affecting a blocking voltage capability $V_{DS}$ between source and drain. Although one device characteristic may be improved by varying a certain device parameter, this may lead to deterioration of another device characteristic. As an example, the area-specific on-state resistance $R_{DS(on)}$ may be improved by, for instance, increasing a drift zone doping concentration, which may, however, lead to deterioration of the blocking voltage capability VDS between source and drain. Thus, device parameters are designed during technology development based on a number of tradeoffs to be met in view of target device specifications.

There is a need to improve semiconductor devices based on silicon carbide.

SUMMARY

An embodiment of the present disclosure relates to a semiconductor device that includes a silicon carbide semiconductor body comprising a source region of a first conductivity type and a body region of a second conductivity type. The semiconductor device further includes a trench structure extending from a first surface into the silicon carbide semiconductor body along a vertical direction, wherein the trench structure comprises a gate electrode and a gate dielectric. The semiconductor device further includes a contact electrically connected to the source region at the first surface. The source region comprises a first source sub-region directly adjoining the contact at a source contact area of the first surface, a second source sub-region, and a third source sub-region. The second source sub-region is arranged between the first source sub-region and the third source sub-region along the vertical direction. A doping concentration profile of the source region along the vertical direction includes a doping concentration minimum in the second source sub-region and a doping concentration maximum in the third source sub-region. Each of the second source sub-region and the third source sub-region overlaps with the source contact area.

Another embodiment of the present disclosure relates to another semiconductor device that includes a silicon carbide semiconductor body comprising a source region of a first conductivity type and a body region of a second conductivity type. The semiconductor device further includes a trench structure extending from a first surface into the silicon carbide semiconductor body along a vertical direction, wherein the trench structure comprises a gate electrode and a gate dielectric. The trench structure is stripe-shaped and runs along a longitudinal direction that is perpendicular to the vertical direction. The source region comprises a first source sub-region and a second source sub-region alternately arranged along the longitudinal direction. A doping concentration profile of the first source sub-region along the vertical direction differs from a doping concentration profile of the second source sub-region along the vertical direction.

An embodiment of the present disclosure relates to a method of manufacturing a semiconductor device. The method comprises forming a source region of a first conductivity type and a body region of a second conductivity type in a silicon carbide semiconductor body. The method further comprises forming a trench structure extending from a first surface into the silicon carbide semiconductor body along a vertical direction, wherein the trench structure comprises a gate electrode and a gate dielectric. The method further comprises forming a contact electrically connected to the source region at the first surface. The source region comprises a first source sub-region directly adjoining the contact at a source contact area of the first surface, a second source sub-region, and a third source sub-region. The second source sub-region is arranged between the first source sub-region and the third source sub-region along the vertical direction. A doping concentration profile of the source region along the vertical direction includes a doping concentration minimum in the second source sub-region and a doping concentration maximum in the third source sub-region. Each of the second source sub-region and the third source sub-region overlaps with the source contact area.

An embodiment of the present disclosure relates to another method of manufacturing a semiconductor device. The method includes forming a source region of a first conductivity type and a body region of a second conductivity type in a silicon carbide semiconductor body. The method further includes forming a trench structure extending from a first surface into the silicon carbide semiconductor body along a vertical direction, wherein the trench structure comprises a gate electrode and a gate dielectric. The trench structure is stripe-shaped and runs along a longitudinal direction that is perpendicular to the vertical direction. The source region comprises a first source sub-region and a second source sub-region alternately arranged along the longitudinal direction. A doping concentration profile of the first source sub-region along a vertical direction differs from a doping concentration profile of the second source sub-region along the vertical direction.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the present embodiments and are incorporated in and constitute a part of this specification. The drawings illustrate the present embodiments of the semiconductor device and the method of manufacturing a semiconductor device, and together with the description serve to explain principles of the embodiments. Further embodiments and intended advantages will be readily appreciated as they become better understood by reference to the following detailed description. Further embodiments are described in the following detailed description and the claims.

DETAILED DESCRIPTION

Figure 1:
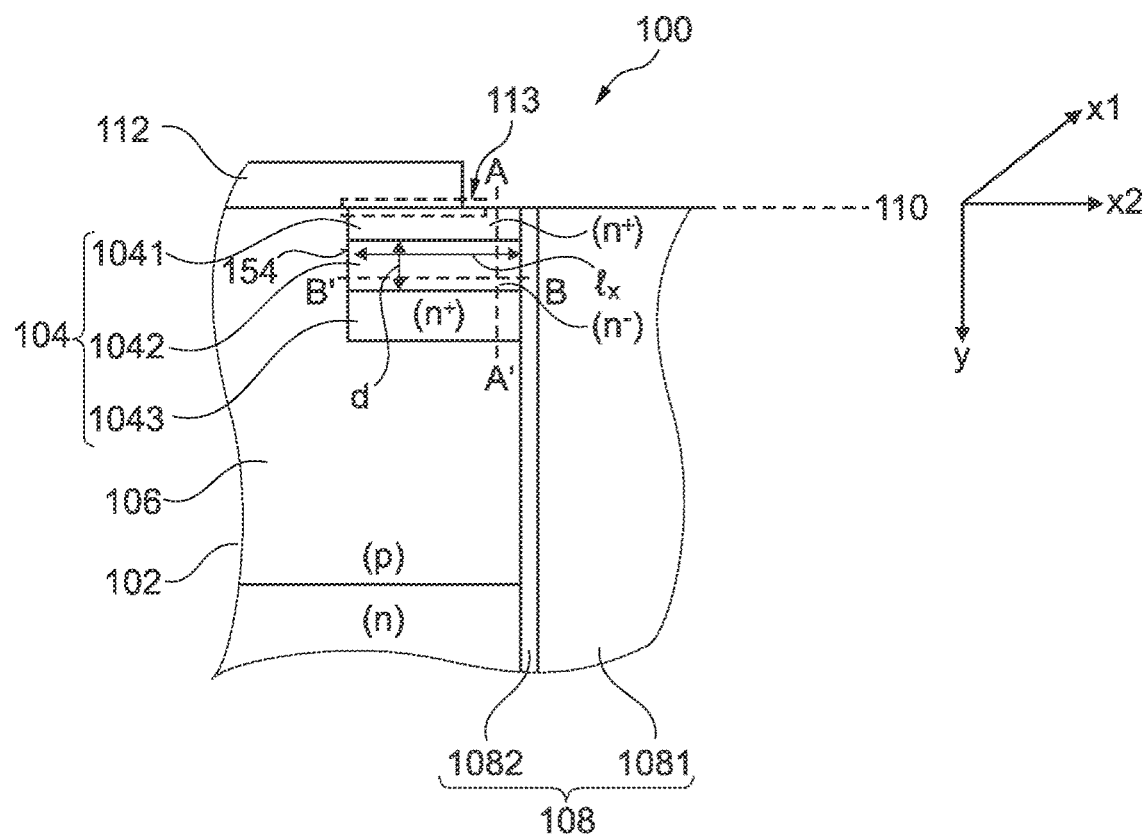
FIG. 1 illustrates a cross-sectional view of embodiment of an embodiment of a silicon carbide semiconductor device including source sub-regions.

In the following detailed description, reference is made to the accompanying drawings, which form a part thereof and in which are shown by way of illustrations specific embodiments in which a semiconductor device may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise. If two components "adjoin" each other, they may either be in direct contact with each other (i.e., directly adjoin each other) at least in places or may be separated from each other by only a small distance. The small distance may be at most 100 nm, typically at most 20 nm or at most 10 nm.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening element(s) adapted for signal and/or power transmission may be between the electrically coupled elements, for example, elements that are controllable to temporarily provide a low-resistive connection in a first state and a high-resistive electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Two directly adjoining doping regions of the same conductivity type and with different dopant concentrations form a unipolar junction, e.g., an n/n+ or p/p+ junction along a boundary surface between the two doping regions. At the unipolar junction a dopant concentration profile orthogonal to the unipolar junction may show a step or a turning point, at which the dopant concentration profile changes from being concave to convex, or vice versa.

Ranges given for physical dimensions include the boundary values. For example, a range for a parameter y from a to b reads as a≤y≤b. A parameter y with a value of at least c reads as c≤y and a parameter y with a value of at most d reads as y≤d.

IGFETs (insulated gate field effect transistor) are voltage-controlled devices including MOSFETs (metal oxide semiconductor FETs) and other FETs with gate electrodes based on doped semiconductor material and/or with gate dielectrics that are not or not exclusively based on an oxide.

According to an embodiment a semiconductor device may include a silicon carbide semiconductor body comprising a source region of a first conductivity type and a body region of a second conductivity type. The semiconductor device may further include a trench structure extending from a first surface into the silicon carbide semiconductor body along a vertical direction, wherein the trench structure may comprise a gate electrode and a gate dielectric. The semiconductor device may further include a contact electrically connected to the source region at the first surface. The source region may comprise a first source sub-region directly adjoining the contact at a source contact area of the first surface, a second source sub-region, and a third source sub-region. The second source sub-region may be arranged between the first source sub-region and the third source sub-region along the vertical direction. A doping concentration profile of the source region along the vertical direction may include a doping concentration minimum in the second source sub-region and a doping concentration maximum in the third source sub-region. Each of the second source sub-region and the third source sub-region may overlap with the source contact area.

The doping concentration maximum in the third source sub-region may be a local maximum. The doping concentration minimum in the second source sub-region may be a local, in particular, a global minimum. For example, the doping concentration profile of the source region may comprise a global maximum in the first source sub-region. In some embodiments, the maximum in the third source sub-region may be the second-highest maximum of the doping concentration profile of the source region.

It may be possible that the maximum in the third source sub-region and/or the minimum in the second source sub-region are/is not very pronounced. This may be the case if the doping concentration in the third source sub-region is relatively low (e.g., at most 60%) compared to the doping concentration in the first source sub-region or if the maximum in the third source sub-region is close to the minimum in the second source sub-region due to overlap of different ion implanted doping profiles, for example. In this case, the doping concentration profile may show a shoulder-like and/or flattened curve in the area of the maximum in the third source sub-region and the minimum in the second source sub-region due to an overlap of the doping concentrations in the first source sub-region and in the second source sub-region and an overlap of the doping concentrations in the second source sub-region and in the third source sub-region.

The first conductivity type may be n-type and the second conductivity type may be p-type. Alternatively, the first conductivity type may be p-type and the second conductivity type may be n-type.

The silicon carbide (SiC) semiconductor body may be from a hexagonal phase of silicon carbide, e.g., 4H—SiC. The silicon carbide semiconductor body may have an off-direction, for example in a <11-20> or a <1-100> direction. An off-axis angle of the silicon carbide semiconductor body may be in a range from 2° to 8°, typically 4°. The first surface of the silicon carbide semiconductor body may be a main extension plane of the silicon carbide semiconductor body and is spanned by lateral directions. The vertical direction may run perpendicular to the first surface and/or the lateral directions.

The trench structure may be vertical with respect to the first surface or may taper with increasing distance to the first surface. For example, a taper angle of the trench gate structures with respect to the vertical direction may be equal to the off-axis angle or may deviate from the off-axis angle by not more than ±2 degree (e.g. not more than ±1 degree) such that at least a first mesa sidewall of two opposite longitudinal mesa sidewalls of the SiC mesa is formed in a crystal plane in which charge carrier mobility is high, e.g., a {11-20} crystal plane.

The gate dielectric may separate the gate electrode from the silicon carbide semiconductor body along at least one side of the trench structure. The gate dielectric may include or consist of thermally grown or deposited silicon oxide, silicon nitride, silicon oxynitride, another deposited dielectric material or any combination thereof. A thickness of the gate dielectric may be selected to obtain transistor cells with a threshold voltage in a range from 1.0 V to 8 V, e.g. in a range between 3.0 V and 7.0 V, for example. The trench structure may exclusively include the gate electrode and the gate dielectric or may include further conductive and/or dielectric structures in addition to the gate electrode and the gate dielectric. The gate electrode and any optional additional auxiliary electrode may include or consist of an electrode material or a combination of electrode materials, for example a doped semiconductor material (e.g., a degenerate doped semiconductor material) such as doped polycrystalline silicon, metal or metal compound, for example.

The first source sub-region may directly adjoin the second sub-region and the second source sub-region may directly adjoin the third source sub-region. In other words, the first source sub-region may not be spaced apart from the second source sub-region at a vertical distance, and the second source sub-region may not be spaced apart from the third source sub-region at a vertical distance. Apart from the first to third sub-regions, the source region may also include further source sub-regions, e.g. a fourth source sub-region directly adjoining a bottom side of the third source sub-region. In some embodiments, the doping concentration minimum in the second source sub-region may be formed by merging a first doping concentration tail decreasing from the first source sub-region toward the third source sub-region and a second doping concentration tail decreasing from the third source sub-region toward the first source sub-region. Thus, the first to third source regions may be defined by sections of the vertical doping concentration profile of the source region along the vertical direction, wherein the sections directly adjoin to one another along the vertical direction. In some embodiments, the second source sub-region may include two or more doping concentration minima, and one or more doping concentration maxima. Any doping concentration maximum in the second source sub-region may be smaller than the doping concentration maximum in the first and/or third source-sub-region. The doping concentration profile along the vertical direction may allow for adjusting a bulk resistance of the source region. The bulk resistance may be adjusted for providing a voltage drop during short-circuit current load that enables counteracting current filaments and that may reduce the effective gate overvoltage. When adjusting the bulk resistance of the source region, a trade-off between i) counteracting current filaments and/or reduced effective gate overvoltage during short-circuit current load by increasing the bulk resistance of the source region and ii) decreasing an on-state resistance of the device by decreasing the bulk resistance of the source region may also be taken into account, for example.

In some embodiments a doping concentration maximum in the third source sub-region may be smaller than a doping concentration maximum in the first source sub-region. The doping concentration maximum in the first sub-region may be located at the first surface or at a small vertical distance to the first surface. The small vertical distance may be a vertical distance smaller than 50 nm, e.g. smaller than 30 nm or smaller than 10 nm, for example. Thereby, an electric contact resistance between the first source sub-region and the contact may be reduced or minimized. The contact may include or consist of a conductive material or a combination of conductive materials, for example a doped semiconductor material (e.g., a degenerate doped semiconductor material) such as doped polycrystalline silicon, metal or metal compound, for example.

When the second (third) source sub-region overlaps with the source contact area, a vertical projection of the second (third) source sub-region to the first surface coincides at least in part with the source contact area. In other words, in a plan view of the semiconductor device, areas of the second (third) source sub-region and the source contact area coincide at least in part. In the vertical direction, the source contact area may be positioned directly above the second and/or the third source sub-region, for example. This allows for a compact transistor cell design. Outside of the source contact area, a dielectric may directly adjoin the first source sub-region, for example. The dielectric may also cover a top of the trench structure, for example.

According to an embodiment of the semiconductor device, the gate electrode may be directly opposed to each of the first source sub-region, the second source sub-region and the third source sub-region. In other words, the gate electrode faces each of the first source sub-region, the second sub-region and the third source sub-region along a lateral direction parallel to the first main surface. Thus, a part of the gate electrode is arranged at a same vertical distance to the first main surface as each of the first to third source sub-regions. This may allow for reducing or minimizing a gate resistance to a gate pad, for example.

According to an embodiment of the semiconductor device, the doping concentration profile of the source region along the vertical direction may include a doping concentration valley in the second source sub-region and a doping concentration peak in the third source sub-region. The doping concentration peak may be caused by an ion implantation process of dopants through the first surface, for example. The doping valley in the second source sub-region may be caused by merging a first doping concentration tail decreasing from the first source sub-region toward the third source sub-region and a second doping concentration tail decreasing from the third source sub-region toward the first source sub-region, for example. By adjusting the doping tail, a bulk resistance of the source region may be optimized, for example.

According to an embodiment of the semiconductor device, a lateral extent of the second source sub-region may be defined between i) an interface to a sidewall of the trench structure and ii) a pn junction to the body region. A doping concentration profile of the second source sub-region may be constant along at least 80% of the lateral extent. In other words, the second source sub-region may not be divided into multiple sub-regions having different doping concentrations. Thus, the second source region may be formed by a single photolithographic process, e.g. including one or more ion implantation processes involving a mask on the first surface. This may allow for a simple and cost-efficient adjustment of the bulk resistance of the source, for example.

According to an embodiment of the semiconductor device, the doping concentration minimum in the second source sub-region may be in a range from at least 0.01% to at most 50% of the doping concentration maximum in the third source sub-region, or from 0.1% to at most 50% or from 1% to at most 30%, of the doping concentration maximum in the third source sub-region. Thereby, a bulk resistance of the source region may be optimized, for example.

According to an embodiment of the semiconductor device, a vertical extent of the second source sub-region may be in a range from at least 30 nm to at most 500 nm, or from at least 50 nm to at most 200 nm, or from at least 80 nm to at most 150 nm. The vertical extent may be adjusted depending on the doping concentration for setting a desired bulk resistance of the source region, for example.

According to an embodiment of the semiconductor device, at least a part of the second source sub-region may comprise dopants of the second conductivity type, wherein the dopants of the second conductivity type may partially compensate dopants of the first conductivity type in a range from at least 10% to at most 99.9%, or in a range from at least 10% to at most 90%, or in a range from 20% to 80%, or in a range from 30% to 70%. Partial compensation of dopants means that donors outnumber acceptors or vice versa. Partial compensation provides a further degree of freedom for adjusting a desired bulk resistance of the source region. Partial compensation may not only be used to increase or decrease the number of donors or acceptors, but the electron and hole mobility may also be decreased by compensation because the mobility is affected by the sum of the donor and acceptor ions. As an example, p-type dopants in SiC, e.g. aluminum (Al) and/or Ga (Ga) and or boron (B) may be used for partially compensating an n-type doping caused by n-type dopants in SiC, e.g. phosphorus (P) and/or nitrogen (N), and vice versa.

According to an embodiment, the semiconductor device may comprise lattice defects in the second source sub-region, wherein the lattice defects reduce the mobility of free charge carriers and furthermore can decrease the effective doping concentration in the second source sub-region by a partial compensation of the donors in the second source sub-region. Exemplary implantation particles for such a mobility reduction and partial counter-doping are argon (Ar), protons, helium (He), resulting for example in $Z_{1/2}$ defects involving a carbon vacancy. Provision of the lattice defects may provide a further degree of freedom for adjusting a desired bulk resistance of the source region.

According to an embodiment a semiconductor device may include a silicon carbide semiconductor body comprising a source region of a first conductivity type and a body region of a second conductivity type. The semiconductor device may further include a trench structure extending from a first surface into the silicon carbide semiconductor body along a vertical direction, wherein the trench structure may comprise a gate electrode and a gate dielectric. The trench structure may be stripe-shaped and run along a longitudinal direction that is perpendicular to the vertical direction. The source region may comprise a first source sub-region and a second source sub-region alternately arranged along the longitudinal direction. A doping concentration profile of the first source sub-region along the vertical direction may differ from a doping concentration profile of the second source sub-region along the vertical direction. The embodiment may allow for adjusting a bulk resistance of the source region depending on one or more of lateral extents of the first and second source sub-regions along the longitudinal direction, the doping concentration profiles of the first and second source sub-regions along the vertical direction, contact schemes for electrically connecting the first and/or second source sub-regions at the first surface. The embodiment may be combined with any of the embodiments described above. In other words, each of the first and second sub-regions may be divided into at least three sub-regions along the vertical direction as described in the embodiments above.

According to an embodiment of the semiconductor device, an amount of doping of the first conductivity type may be greater in the first source sub-region than in the second source sub-region. The amount of doping of a source sub-region may correspond to a vertical integral of dopants of the first conductivity type between a top and a bottom of the source sub-region, for example. In some examples, the amount may correspond to a total ion implantation dose used for manufacturing the source sub-region. The amount of doping is a number of dopants per unit area, e.g. $cm^{-2}$. The dopants of the first conductivity type may include one or more dopant species of the first conductivity type, e.g. one or more of dopant elements such as phosphorus (P) and nitrogen (N) and other suitable elements or complexes for n-type doping or one or more of dopant elements such as boron (B), gallium (Ga) and aluminum (Al) and other suitable elements or complexes for p-type doping. The term "dopant species" denotes a specific dopant element, e.g. P for n-type doping or B for p-type doping in silicon carbide. For example, the dopants may be introduced into the silicon carbide semiconductor body by means of ion implantation and/or during epitaxial growth.

According to an embodiment, the semiconductor device may further comprise a contact and a dielectric, wherein the contact may be electrically connected to the source region at the first surface. The dielectric may at least partially be replaced by a cavity (i.e., a hollow space). The contact may directly adjoin at least a part of the first source sub-region at the first surface, and the dielectric may adjoin at least a part of the second source-sub-region at the first surface. In some embodiments, the contact may only directly contact the first source sub-regions, and the second source sub-regions may be free of a direct contact to the contact.

According to an embodiment, the semiconductor device may further comprise a doped region of the second conductivity type arranged between the second source-sub-region and the first surface.

According to an embodiment, the semiconductor device may further comprise a current spread region of the first conductivity type. The semiconductor device may further comprise a drift region of the first conductivity type, wherein the drift region may be arranged between the current spread region and a semiconductor substrate of the first conductivity type and/or between the current spread region and a contact region of the first conductivity type and/or between the current spread region and a buffer or drain region. A doping concentration of the current spread region may be larger than a doping concentration of the drift region. Exemplary values for a mean net dopant concentration in the drift region may be in the range from $10^{15}$ cm$^{-3}$ to $5\times10^{16}$ cm$^{-3}$. A mean net dopant concentration in the current spread region may be larger than the mean net dopant concentration in the drift region, e.g. by a factor range of 5 to 1000, or a factor range 10 to 500, or a factor of 50 to 200, for example. Arrangement of the current spread region may allow for a further reduction of the area-specific on-state resistance RDS(on), for example.

According to an embodiment, the semiconductor device may further comprise a shielding region of the second conductivity type directly adjoining at least a bottom part of the trench structure. The shielding region may protect the gate dielectric from high electric field strengths occurring during a reverse voltage mode of the semiconductor device, for example. The shielding region may also adjoin a sidewall of the trench structure. The shielding region and the body region may adjoin the trench structure from opposite sidewalls, for example. The body region may also adjoin the trench structure from opposite sidewalls of the trench structure and the shielding region may adjoin the trench structure at a bottom of the trench structure, for example. A maximum dopant concentration in the shielding region may be higher than a maximum dopant concentration in the body region. However, in other embodiments, the maximum dopant concentration in the shielding region may be lower than a maximum dopant concentration in the body region. A vertical dopant concentration profile in the shielding region may have a local maximum at a position below the trench gate structure. In addition to the protection function of the shielding region, the shielding region may also provide the silicon carbide device with an integrated fly-back diode (also called "body diode") functionality.

According to an embodiment of the semiconductor device, the contact may comprise a positive temperature coefficient (PTC) material directly adjoining the source region. PTC materials are conductive materials that typically have at least a gradual increase, in particular a sharp increase, in resistivity upon reaching a switching temperature. If the jump in resistivity is sufficiently high, the resistivity may effectively block current and further local heating of the semiconductor device may be prevented or counteracted. Exemplary PTC materials are conductive polymer composites and/or barium titanate.

According to an embodiment a method of manufacturing a semiconductor device may comprise forming a source region of a first conductivity type and a body region of a second conductivity type in a silicon carbide semiconductor body. The method may further comprise forming a trench structure extending from a first surface into the silicon carbide semiconductor body along a vertical direction, wherein the trench structure may comprise a gate electrode and a gate dielectric. The method may further comprise forming a contact electrically connected to the source region at the first surface, wherein the source region may comprises a first source sub-region directly adjoining the contact at a source contact area of the first surface, a second source sub-region, and a third source sub-region. The second source sub-region may be arranged between the first source sub-region and the third source sub-region along the vertical direction. A doping concentration profile along the vertical direction of the source region may include a doping concentration minimum in the second source sub-region and a doping concentration maximum in the third source sub-region. Each of the second source sub-region and the third source sub-region may overlap with the source contact area.

According to an embodiment of the method of manufacturing the semiconductor device, the first source sub-region, the second source sub-region, the third source sub-region may be formed by ion implantation processes using one and the same ion implantation mask. In some embodiments, the first to third source sub-regions may be formed by two ion implantations having different ion implantation energies. A doping peak of one of the two ion implantations may define a doping concentration maximum in the third source sub-region and a doping concentration peak of the other one of the two ion implantations may define a doping concentration maximum in the first source sub-region, for example. A doping concentration minimum in the second source sub-region may be defined by an overlap of doping concentration tails of the two ion implantation profiles, for example. Also, more than two ion implantations may be used to form the first to third source sub-regions.

According to an embodiment a method of manufacturing a semiconductor device may comprise forming a source region of a first conductivity type and a body region of a second conductivity type in a silicon carbide semiconductor body. The method may further comprise forming a trench structure extending from a first surface into the silicon carbide semiconductor body along a vertical direction, wherein the trench structure may comprise a gate electrode and a gate dielectric. The trench structure may be stripe-shaped and run along a longitudinal direction that is perpendicular to the vertical direction. The source region may comprise a first source sub-region and a second source sub-region alternately arranged along the longitudinal direction. A doping concentration profile of the first source sub-region along a vertical direction may differ from a doping concentration profile of the second source sub-region along the vertical direction.

The methods may be applied for manufacturing the semiconductor device as described with respect to any of the above embodiments or any of the embodiments described below in connection with the figures. In at least some embodiments of the method, the following features (if applicable) apply, alone or in combination:

(i) forming at least one of the source region, the body region, the current spread region and the shielding region may include at least one masked or unmasked ion implantation process;

(ii) forming the source region may include two or more ion implantation processes having different ion implantation energies/ion implantation doses, wherein the ion implantation processes may be carried out based on different ion implantation masks or may be carried out based on a common ion implantation mask;

(iii) forming the source region may include introducing lattice defects in the second source sub-region by one or more ion implantation processes.

It will be appreciated that while the method is described above and below as a series of steps or events, the described ordering of such steps or events are not to be interpreted in a limiting sense. Rather, some steps may occur in different orders and/or concurrently with other steps or events apart from those described above and below.

Functional and structural details described with respect to the embodiments above shall likewise apply to the exemplary embodiments illustrated in the figures and described further below.

Referring to the schematic cross-sectional view of FIG. 1, an embodiment of a semiconductor device 100 is illustrated.

The semiconductor device 100 includes a silicon carbide semiconductor body 102 comprising an n$^+$-doped source region 104 and a p-doped body region 106. A trench structure 108 extends from a first surface 110 into the silicon carbide semiconductor body 102 along a vertical direction y. The trench structure 108 includes a gate electrode 1081 and a gate dielectric 1082. A contact 112 is electrically connected to the source region 104 at the first surface 110. The source region 104 comprises a first source sub-region 1041 directly adjoining the contact 112 at a source contact area 113 of the first surface 110. The source region 104 further includes a second source sub-region 1042 and a third source sub-region 1043. The second source sub-region 1042 is arranged between the first source sub-region 1041 and the third source sub-region 1043 along the vertical direction y. Each of the second source sub-region 1042 and the third source sub-region 1043 overlaps with the source contact area 113. The trench structure 108 may be stripe-shaped and run along a longitudinal direction x1, for example.

Figure 2A:
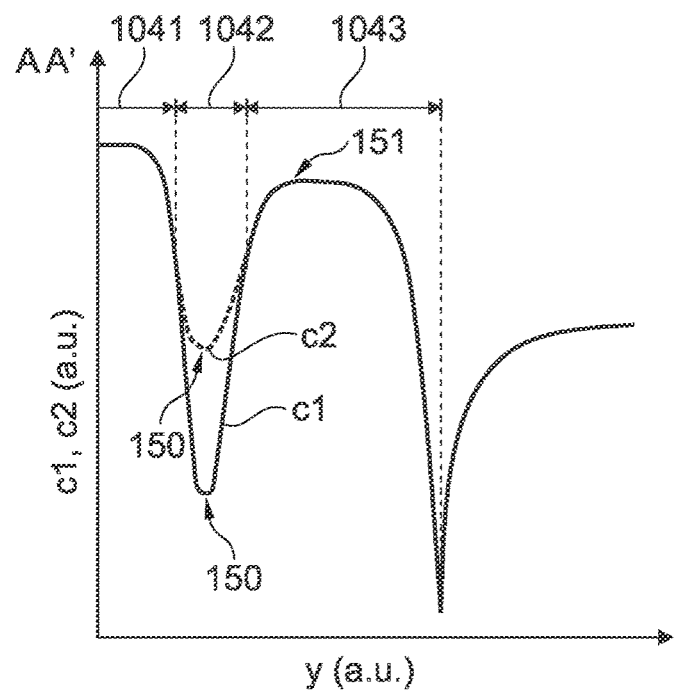
FIGS. 2A and 2B are exemplary graphs for illustrating vertical doping profiles along a line AA' of the semiconductor device illustrated in FIG. 1.
Figure 2B:
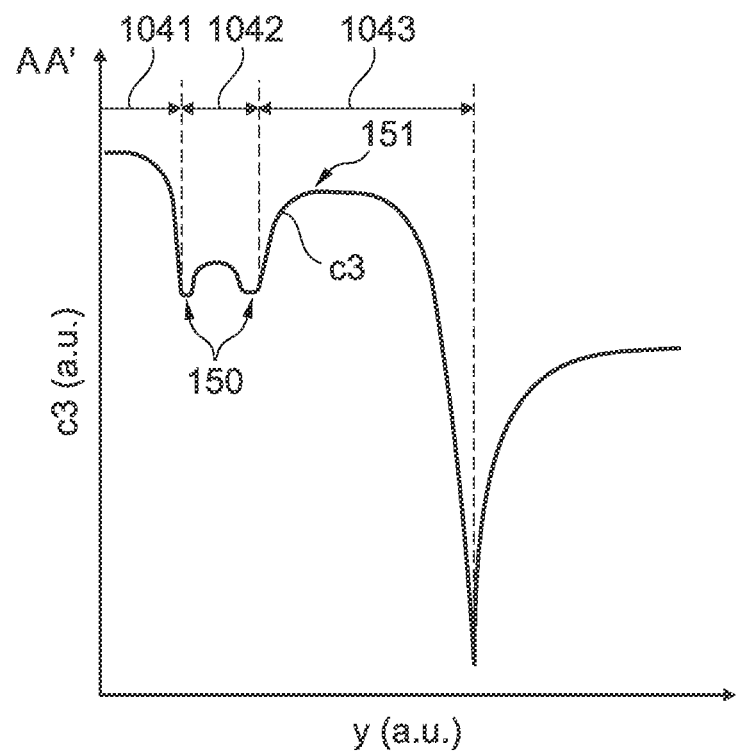

Exemplary profiles of a doping concentration c1, c2, c3 of the source region 104 along a line AA' of FIG. 1 are illustrated in the schematic diagrams of FIGS. 2A to 2B.

Referring to FIG. 2A, the doping concentrations c1, c2 along the vertical direction y of the source region 104 include a doping concentration minimum or valley 150 in the second source sub-region 1042 and a doping concentration maximum or peak 151 in the third source sub-region 1043. A doping concentration value at the minimum 150 may be adjusted with respect to a desired bulk resistance of the source region 104, for example.

Referring to the profile of the doping concentration c3 illustrated in FIG. 2B, the second source sub-region 1042 has more than one doping concentration minimum 150. In the example illustrated in FIG. 2B, two doping concentration minima and one doping concentration maximum are present in the second source sub-region 1042. The number of doping minima and doping maxima may also be larger than illustrated in FIG. 2B.

In the embodiments described and illustrated herein, a plurality of trench structures 108 may be equally spaced, may have equal width, and may form a regular stripe pattern, wherein a center-to-center distance between the trench structures 108 may be in a range from 1 µm to 10 µm, e.g., from 2 µm to 5 µm. A length of the trench structures 108 along the longitudinal direction x1 may be up to several millimeters (e.g. at least 300 µm and at most 2 mm). A vertical extension of the trench structures 108 may be in a range from 0.3 µm to 5 µm, e.g., in a range from 0.5 µm to 2 µm. At the bottom, the trench structures 108 may be rounded.

In other embodiments (not shown in the Figures), the trench structures 108 may be of a circular, a hexagonal or a square shape. The lateral width may then approximately correspond to the length of the trench structure 108. A channel region and/or the body region may adjoin more than one sidewall or even more than two sidewalls of the trench structure.

Figure 3:
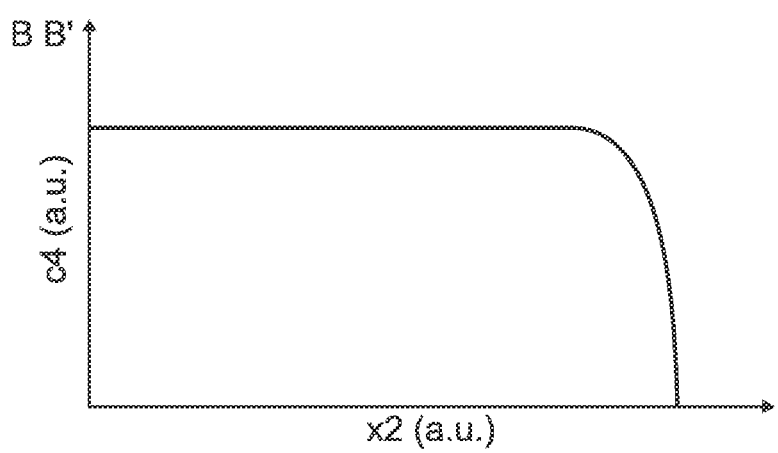
FIG. 3 is an exemplary graph for illustrating a lateral doping concentration profile along a line BB' of the semiconductor device illustrated in FIG. 1.

The schematic diagram of FIG. 3 illustrates a profile of doping concentration c4 along a lateral direction x2 defining a lateral extent of the second source sub-region 1042 (see exemplary line BB' in FIG. 1). The lateral extent of the second source sub-region 1042 is defined between i) an interface to a sidewall of the trench structure 108 and ii) a pn junction 154 to the body region 106. The doping concentration c4 of the second source sub-region 104 is constant along at least 80% of the lateral extent.

Figure 4:
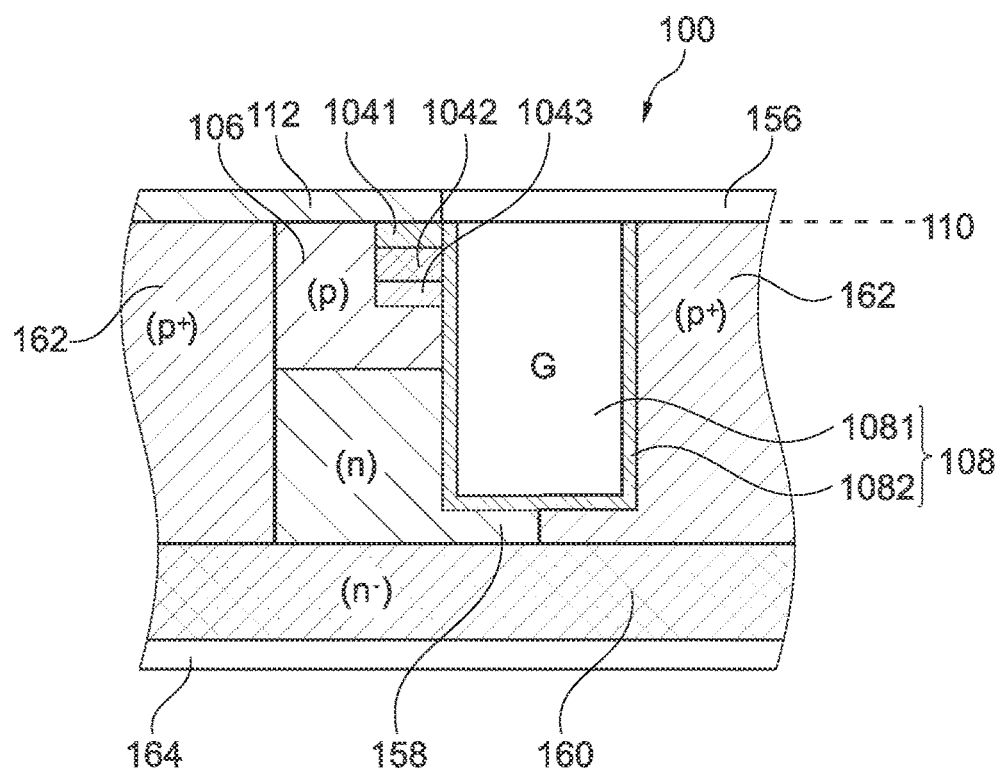
FIGS. 4 and 5 illustrate cross-sectional views of embodiments of silicon carbide semiconductor devices including source sub-regions.

Another embodiment of the semiconductor device 100 is illustrated in the schematic cross-sectional view of FIG. 4.

The semiconductor device 100 includes a dielectric 156. The contact 112 directly adjoins a first part of the first source sub-region 1041 at the first surface 110, and the dielectric 156 adjoins a second part of the first source-sub-region 1041 at the first surface 110.

The semiconductor device 100 further includes an n-doped current spread region 158. The semiconductor device 100 further includes an n$^-$-doped drift region 160, wherein the drift region 160 is arranged between the current spread region 158 and a semiconductor substrate and/or between the current spread region 158 and a contact region 164 and/or between the current spread region and a buffer or highly doped drain contact region. A doping concentration of the current spread region 158 is larger than a doping concentration of the drift region 160.

The semiconductor device 100 further includes a p$^+$-doped shielding region 162 directly adjoining at least a bottom part of the trench structure 108. The shielding region 162 also adjoins a sidewall of the trench structure 108 opposite to the sidewall where the source region 104 is arranged.

Figure 5:
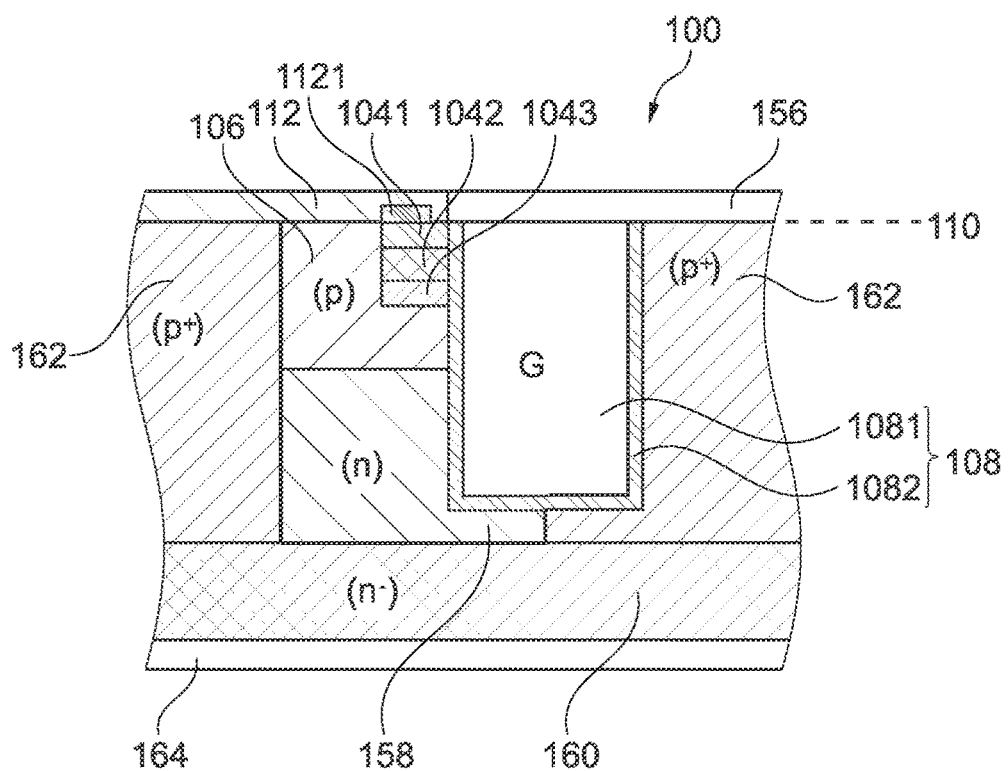

Referring to the schematic cross-sectional view of FIG. 5, the contact 112 of an embodiment of the semiconductor device 100 further comprises a positive temperature coefficient (PTC) material 1121 directly adjoining the source region 104.

Figure 6:
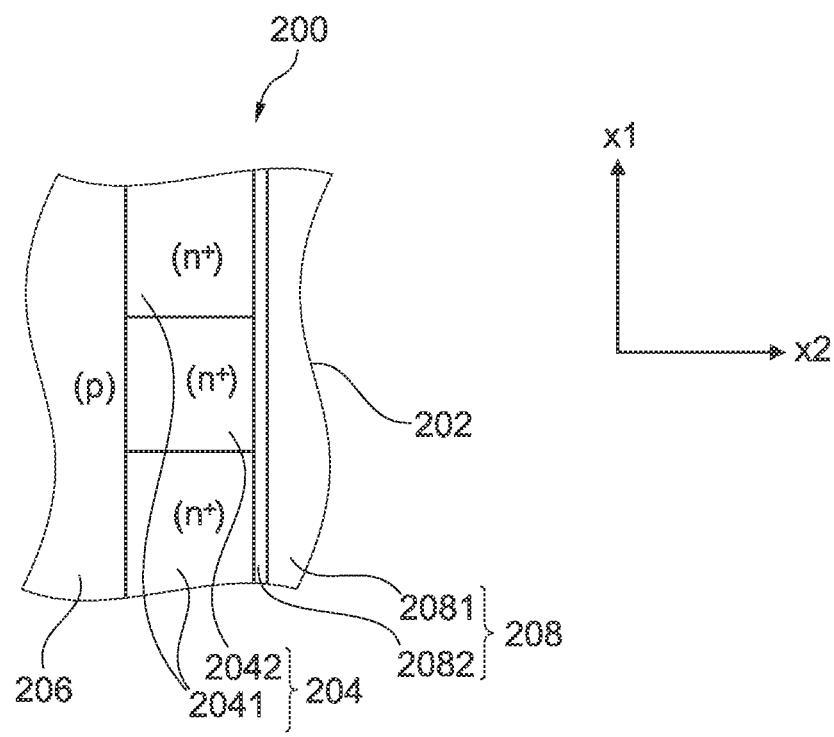
FIG. 6 illustrates a schematic plan view of an embodiment of a silicon carbide semiconductor device including source sub-regions.

Referring to the schematic cross-sectional view of FIG. 6, a top view of an embodiment of a semiconductor device 200 is illustrated.

The semiconductor device 200 includes a silicon carbide semiconductor body 202 comprising an n$^+$-doped source region 204 and a p-doped body region 206. The semiconductor device 200 includes a trench structure 208. The trench structure 208 includes a gate electrode 2081 and a gate dielectric 2082. The trench structure 208 is stripe-shaped and runs along a longitudinal direction x1 that is perpendicular a vertical direction y. The vertical direction y is a direction that is perpendicular to a drawing plane of FIG. 6, for example. The source region 204 includes a first source sub-region 2041 and a second source sub-region 2042 alternately arranged along the longitudinal direction x1. A doping concentration profile of the first source sub-region 2041 along the vertical direction y differs from a doping concentration profile of the second source sub-region 2042 along the vertical direction y.

Figure 7:
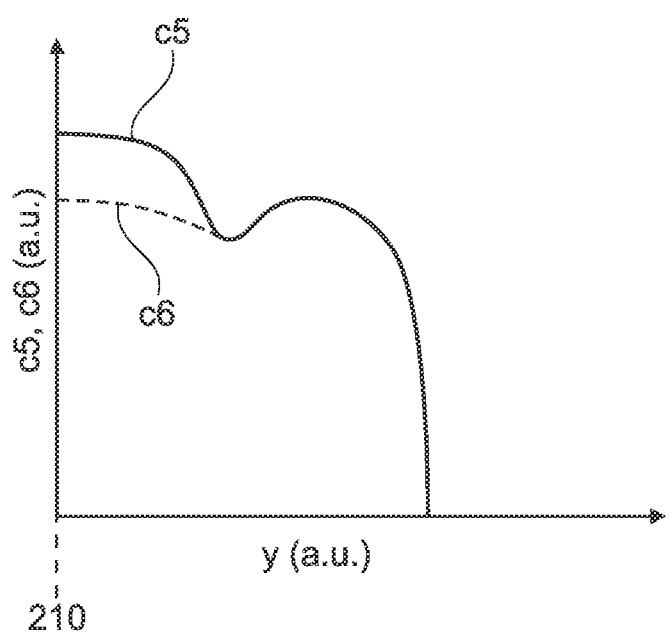
FIG. 7 is an exemplary graph for illustrating different vertical doping concentration profiles of neighboring source sub-regions of the semiconductor device illustrated in FIG. 6.

Referring to the schematic graph of FIG. 7, exemplary profiles of doping concentration profiles along the vertical direction y are illustrated. A profile of doping concentration c5 is taken along the vertical direction y through one of the first and second source sub-regions 2041, 2042, and a profile of doping concentration c6 is taken along the vertical direction through the other one of the first and second source sub-regions 2041, 2042. In the exemplary profile of doping concentration c5, c6 illustrated in FIG. 7, the concentration c5 is larger than the concentration c6 in a region close to the first surface 210. One or both of the profiles of doping concentration of the first and second sub-regions 2041, 2042 along the vertical direction y may be formed along according to an embodiment described above, for example. According to other embodiments, one or both of the profiles of doping concentration of the first and second sub-regions 2041, 2042 may also differ from the profiles described in the embodiments above provided that the profiles of doping concentration of the first and second sub-regions 2041, 2042 differ from one another.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a silicon carbide semiconductor body comprising a source region of a first conductivity type and a body region of a second conductivity type;
a trench structure extending from a first surface of the silicon carbide semiconductor body into the silicon carbide semiconductor body along a vertical direction, the trench structure comprising a gate electrode and a gate dielectric; and
a contact electrically connected to the source region at the first surface,
wherein the source region comprises a first source sub-region directly adjoining the contact at a source contact area of the first surface, a second source sub-region, and a third source sub-region, the second source sub-region being arranged between the first source sub-region and the third source sub-region along the vertical direction,
wherein a doping concentration profile along the vertical direction of the source region includes a doping concentration minimum in the second source sub-region and a doping concentration maximum in the third source sub-region,
wherein each of the second source sub-region and the third source sub-region overlaps with the source contact area.

2. The semiconductor device of claim 1, wherein the gate electrode is directly opposed to each of the first source sub-region, the second source sub-region and the third source sub-region.

3. The semiconductor device of claim 1, wherein the doping concentration profile along the vertical direction of the source region includes a doping concentration valley in the second source sub-region and a doping concentration peak in the third source sub-region.

4. The semiconductor device of claim 1, wherein a lateral extent of the second source sub-region is defined between an interface to a sidewall of the trench structure and a pn junction to the body region, and wherein a doping concentration profile of the second source sub-region is constant along at least 80% of the lateral extent.

5. The semiconductor device of claim 1, wherein the doping concentration minimum in the second source sub-region is in a range of at least 0.01% to at most 50% of the doping concentration maximum in the third source sub-region.

6. The semiconductor device of claim 1, wherein a vertical extent of the second source sub-region is in a range of at least 30 nm to at most 300 nm.

7. The semiconductor device of claim 1, wherein at least a part of the second source sub-region comprises dopants of the second conductivity type, and wherein the dopants of the second conductivity type partially compensate dopants of the first conductivity type in a range of at least 10% to at most 99.9%.

8. The semiconductor device of claim 1, further comprising lattice defects in the second source sub-region, wherein the lattice defects reduce mobility of free charge carriers in the second source sub-region.

9. The semiconductor device of claim 1, further comprising lattice defects in the second source sub-region, wherein the lattice defects reduce an effective n-type doping level in the second source sub-region.

10. A method of manufacturing a semiconductor device, the method comprising:
forming a source region of a first conductivity type and a body region of a second conductivity type in a silicon carbide semiconductor body;
forming a trench structure extending from a first surface of the silicon carbide semiconductor body into the silicon carbide semiconductor body along a vertical direction, the trench structure comprising a gate electrode and a gate dielectric; and
forming a contact electrically connected to the source region at the first surface,
wherein the source region comprises a first source sub-region directly adjoining the contact at a source contact area of the first surface, a second source sub-region, and a third source sub-region,
wherein the second source sub-region is arranged between the first source sub-region and the third source sub-region along the vertical direction,
wherein a doping concentration profile along the vertical direction of the source region includes a doping concentration minimum in the second source sub-region and a doping concentration maximum in the third source sub-region,
wherein each of the second source sub-region and the third source sub-region overlaps with the source contact area.

11. The method of claim 10, wherein the first source sub-region, the second source sub-region and the third source sub-region are formed by ion implantation processes using a same ion implantation mask.

* * * * *